US009343547B2

(12) United States Patent
Wu et al.

(10) Patent No.: US 9,343,547 B2
(45) Date of Patent: May 17, 2016

(54) METHOD FOR FABRICATING A RECESSED CHANNEL ACCESS TRANSISTOR DEVICE

(71) Applicant: NANYA TECHNOLOGY CORP., Taoyuan (TW)

(72) Inventors: Tieh-Chiang Wu, Taoyuan (TW); Wei-Ming Liao, Taoyuan (TW)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/616,750

(22) Filed: Feb. 9, 2015

(65) Prior Publication Data

US 2015/0155367 A1 Jun. 4, 2015

Related U.S. Application Data

(63) Continuation of application No. 14/070,589, filed on Nov. 4, 2013, now abandoned.

(51) Int. Cl.
*H01L 29/66* (2006.01)
*H01L 29/76* (2006.01)
*H01L 21/265* (2006.01)
*H01L 21/28* (2006.01)
*H01L 27/108* (2006.01)
*H01L 29/423* (2006.01)

(52) U.S. Cl.
CPC ........ *H01L 29/66666* (2013.01); *H01L 21/265* (2013.01); *H01L 21/28008* (2013.01); *H01L 27/10823* (2013.01); *H01L 27/10844* (2013.01); *H01L 27/10876* (2013.01); *H01L 29/66621* (2013.01); *H01L 29/66659* (2013.01); *H01L 29/76* (2013.01); *H01L 27/10855* (2013.01); *H01L 29/4236* (2013.01)

(58) Field of Classification Search
None
See application file for complete search history.

(56) References Cited

U.S. PATENT DOCUMENTS

2007/0004151 A1* 1/2007 Rouh ................ H01L 29/66621
438/286
2010/0140687 A1* 6/2010 Chu ..................... H01L 29/4236
257/328

(Continued)

FOREIGN PATENT DOCUMENTS

TW 201334179 8/2013

OTHER PUBLICATIONS

"thereafter." Merriam-Webster.com. 2015. http://www.merriam-webster.com (Aug. 20, 2015).*

(Continued)

*Primary Examiner* — Mohammad Islam
*Assistant Examiner* — Mikka Liu
(74) *Attorney, Agent, or Firm* — Winston Hsu; Scott Margo

(57) ABSTRACT

A trench extends from a main surface of a semiconductor substrate to a predetermined depth. A gate oxide layer is formed in the trench. A buried gate electrode is formed at a lower portion of the trench. The buried gate electrode is capped with a dielectric layer. A pad layer and hard mask layer are formed on the semiconductor substrate. A recess through the pad layer and hard mask layer and into the semiconductor substrate is formed on one side of the trench. A portion of the dielectric layer is revealed within the recess. The hard mask layer is then removed. An ion implantation process is performed to implant dopants on both sides of the trench, thereby forming a source doping region and a drain doping region. The source doping region has a junction depth that is deeper than that of the drain doping region.

3 Claims, 7 Drawing Sheets

(56) References Cited

U.S. PATENT DOCUMENTS

| | | |
|---|---|---|
| 2012/0211813 A1* | 8/2012 | Taketani .................. 257/296 |
| 2012/0273859 A1 | 11/2012 | Oyu |
| 2012/0299090 A1 | 11/2012 | Kim |
| 2014/0001525 A1 | 1/2014 | Kajiyama |

OTHER PUBLICATIONS

"substantial." Merriam-Webster.com. 2015. http://www.merriam-webster.com (Aug. 20, 2015).*

* cited by examiner

METHOD FOR FABRICATING A RECESSED CHANNEL ACCESS TRANSISTOR DEVICE

CROSS REFERENCE TO RELATED APPLICATIONS

This is a continuation of U.S. application Ser. No. 14/070,589 filed Nov. 4, 2013, which is included in its entirety herein by reference.

BACKGROUND OF THE INVENTION

1. Field of the Invention

The present invention relates generally to semiconductor devices. More particularly, the present invention relates to a recessed channel access transistor (RCAT) device for high-density dynamic random access memory (DRAM) applications.

2. Description of the Prior Art

As the size of semiconductor devices shrinks, the gate channel length decreases correspondingly, and short channel effect (SCE) and junction leakage current become very serious problems. Recessed channel access transistor devices (or RCAT devices in short) have been developed to suppressing the short channel effect by physically increasing the gate channel length without an increase in a lateral area of a gate electrode.

Typically, an RCAT transistor has a gate oxide layer formed on sidewalls and the bottom surface of a recess etched into a substrate, where a conductive substance fills the recess. Contrary to a planar gate type transistor having a gate electrode formed on a planar surface of a substrate, the RCAT transistor has a U-shaped channel along the surface of the recess. Therefore, the integration of the recessed-gate transistor can be increased.

However, in a conventional RCAT device, when a drain voltage (Vd) is applied to a capacitor that is electrically connected to an NMOS transistor, agate induced drain leakage (GIDL) problem may occur. The GIDL adversely affects the refresh or data retention characteristic of the DRAM device.

SUMMARY OF THE INVENTION

It is therefore one objective of the present invention to provide an improved recessed channel access transistor device to solve the above-mentioned prior art problems or shortcomings.

According to one embodiment of the invention, a recessed channel access transistor device is provided. A semiconductor substrate having thereon a trench is provided. The trench extends from a main surface of the semiconductor substrate to a predetermined depth. A buried gate electrode is disposed at a lower portion of the trench. Agate oxide layer is formed between the buried gate electrode and the semiconductor substrate. A drain doping region on a first side (cell side) of the trench in the semiconductor substrate and a source doping region on a second side (digit side) of the trench are formed. The source doping region has a junction depth that is deeper than that of the drain doping region. An L-shaped channel is defined along a sidewall surface on the first side and along a bottom surface of the trench between the drain doping region and the source doping region.

According to one aspect of the invention, a method for fabricating a recessed channel access transistor device is provided. A semiconductor substrate having thereon a trench extending from a main surface of the semiconductor substrate to a predetermined depth is prepared. A gate oxide layer is formed on interior surface of the trench. A buried gate electrode is formed at a lower portion of the trench. The buried gate electrode is capped with a dielectric layer. A pad layer and hard mask layer are formed on the main surface of the semiconductor substrate. A recess through the pad layer and hard mask layer and into the semiconductor substrate is formed on one side of the trench, wherein a portion of the dielectric layer is revealed within the recess. The hard mask layer is then removed. Thereafter, an ion implantation process is performed to implant dopants on both sides of the trench, thereby forming a source doping region and a drain doping region in the semiconductor substrate. The source doping region has a junction depth that is deeper than that of the drain doping region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
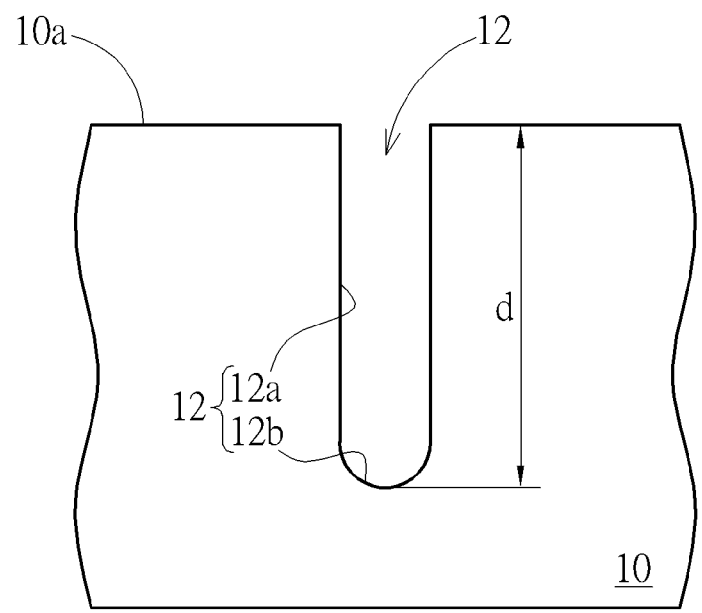
FIGS. 1-7 are schematic, cross-sectional diagrams showing an exemplary method for fabricating a recessed channel access transistor (RCAT) device in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated.

FIGS. 1-7 are schematic, cross-sectional diagrams showing an exemplary method for fabricating a recessed channel access transistor (RCAT) device in accordance with one embodiment of the present invention. As shown in FIG. 1, a semiconductor substrate 10 is provided. The semiconductor substrate 10 may be a silicon substrate, silicon germanium, gallium arsenic or other semiconductor materials. For example, the semiconductor substrate 10 may be a P type silicon substrate. A trench 12 is formed in the semiconductor substrate 10. The trench 12 has a depth d from the main surface 10a of the semiconductor substrate 10. The trench 12 may have a substantially vertical sidewall surface 12a and a bottom surface 12b connected to the sidewall surface 12a.

Figure 2:
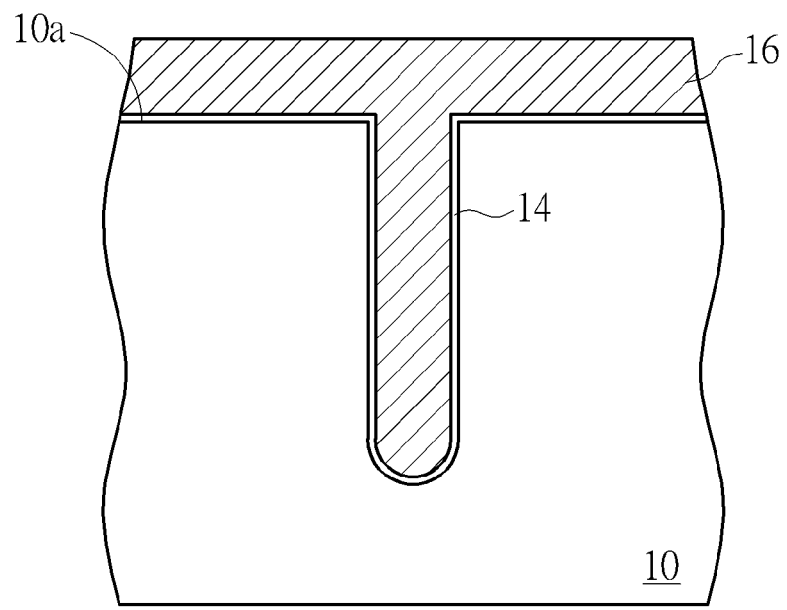

As shown in FIG. 2, an oxidation process may be performed to form a gate oxide layer 14 on the interior surface of the trench 12. A gate electrode layer 16 is then deposited on the gate oxide layer 14 and fills the trench 12. The gate electrode layer 16 may comprise polysilicon, for example.

Figure 3:
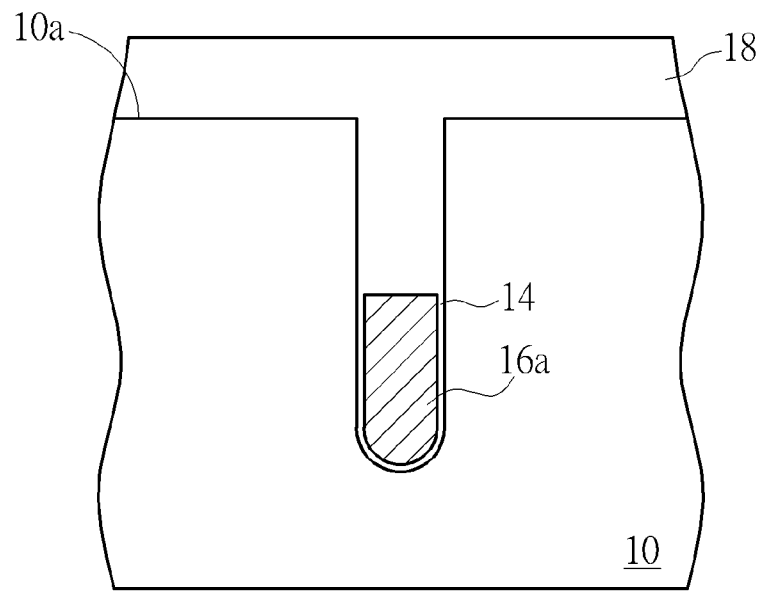

As shown in FIG. 3, an etch back process may be performed to recess the gate electrode layer 16 such that the top surface of the recessed gate electrode layer 16 is lower than the main surface 10a of the semiconductor substrate 10. Subsequently, a dielectric layer 18 such as a silicon oxide layer is deposited over the semiconductor substrate 10 in a blanket manner. The dielectric layer 18 fills the trench 12, thereby forming a buried gate electrode 16a at the lower portion of the trench 12.

Figure 4:
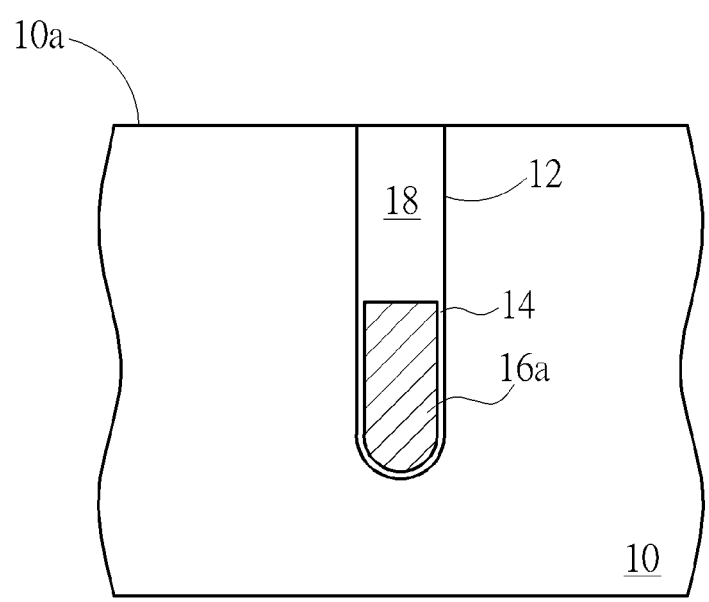

As shown in FIG. 4, a planarization process such as a chemical mechanical polishing (CMP) process is carried out to remove excess dielectric layer 18 from the main surface 10a of the semiconductor substrate 10. At this point, the polished top surface of the dielectric layer 18 is substantially flush with the main surface 10a.

Figure 5:
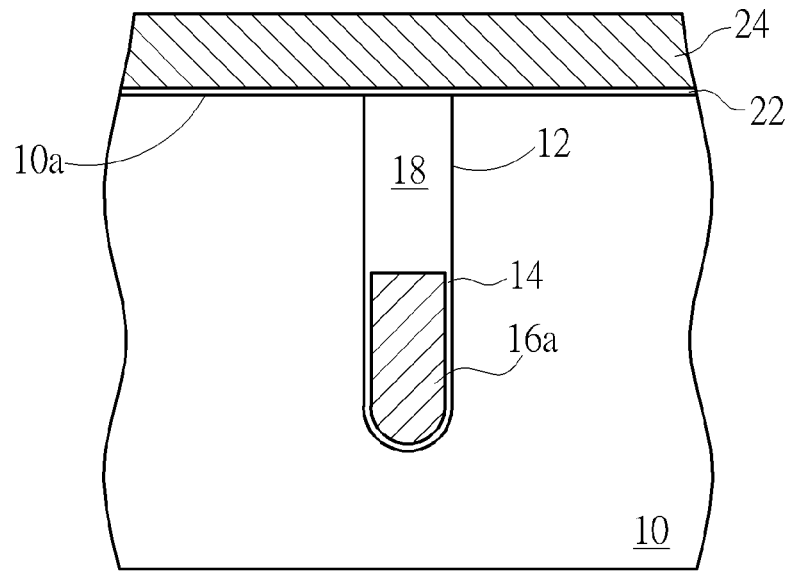

As shown in FIG. 5, a pad layer 22 such as a silicon oxide layer is then deposited in a blanket manner. The pad layer 22 may be a silicon oxide layer. A hard mask layer 24 such as a silicon nitride layer is then deposited on the pad layer 22.

Figure 6:
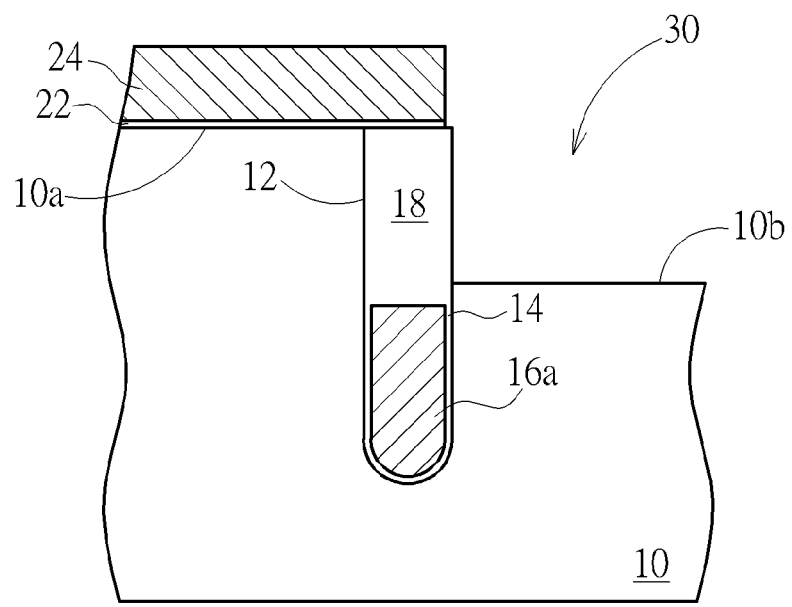

As shown in FIG. 6, a lithographic process and a dry etching process are performed to from a recess 30 in the semiconductor substrate 10 on one single side of the trench 12. At this point, a portion of the dielectric layer 18 is revealed within the recess 30. Within the recess 30, a lower top surface 10b of the semiconductor substrate 10 is formed.

Figure 7:
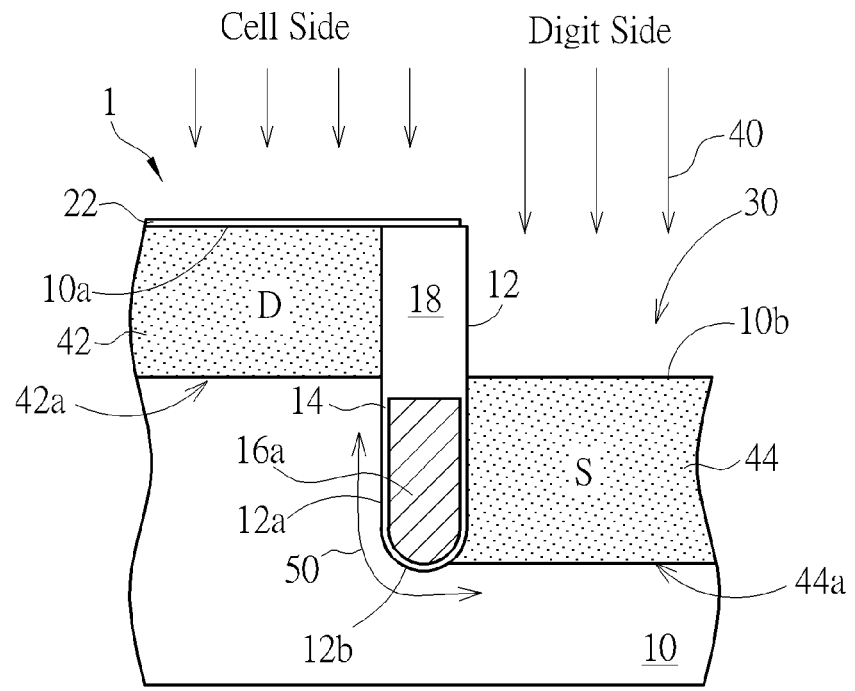

As shown in FIG. 7, the hard mask layer 24 is stripped off, while leaving the pad layer 22 substantially intact. Subsequently, an ion implantation process 40 is performed to implant dopants such as N type dopants into the semiconductor substrate 10 on both sides of the trench 12, that is, the digit side and the cell side in this embodiment, thereby forming a RCAT device 1 with asymmetric drain doping region 42 and source doping region 44.

Due to the recess 30 on the cell side of the RCAT device 1, the PN junction depth 44a of the source doping region 44 on the digit side can be formed deeper than the PN junction depth 42a of the drain doping region 42 on the cell side. An L-shaped channel 50 may be defined along the sidewall surface 12a on the cell side and along the bottom surface 12b of the trench 12 between the drain doping region 42 and the source doping region 44.

According to the embodiment, preferably, PN junction depth 44a of the source doping region 44 on the digit side may be equal to the depth d of the trench 12. Compared to the prior art RCAT devices, the PN junction depth 42a of the drain doping region 42 on the cell side may be shallower in order to maintain an adequate operation current level when operating the RCAT device 1. A contact (not shown) may be formed on the source doping region 44 to couple to a digit line (not shown).

Structurally speaking, according to the embodiment and briefly referring to FIG. 7, the RCAT device 1 comprises a semiconductor substrate 10 having thereon a trench 12 extending from a main surface 10a of the semiconductor substrate 10 to a predetermined depth d, a buried gate electrode 16a disposed at a lower portion of the trench 12, a gate oxide layer 14 between the buried gate electrode 16a and the semiconductor substrate 10, a drain doping region 42 on a first side (cell side) of the trench in the semiconductor substrate 10, and a source doping region 44 on a second side (digit side) of the trench. The source doping region 44 has a junction depth that is deeper than that of the drain doping region 42. An L-shaped channel 50 is defined along a sidewall surface on the first side and along a bottom surface of the trench 12 between the drain doping region 42 and the source doping region 44.

Figure 8:
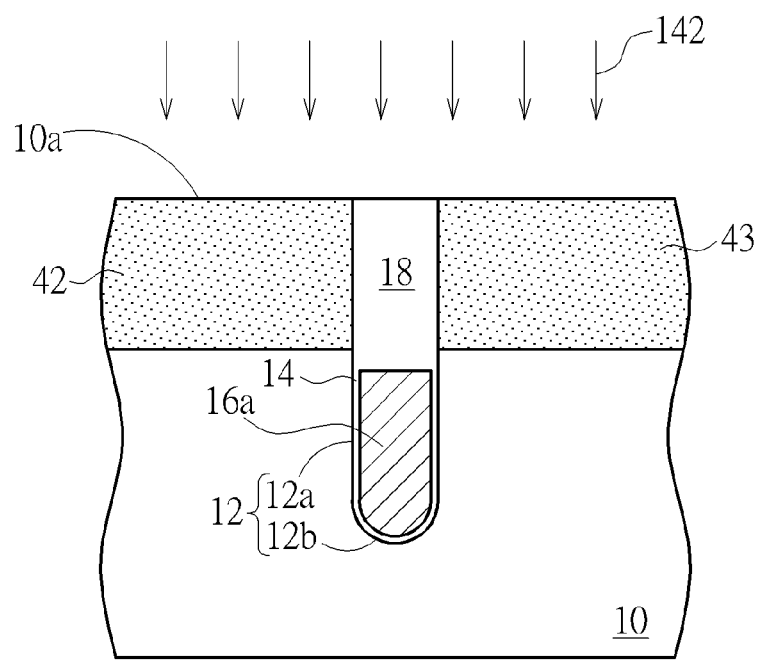
FIGS. 8-10 are schematic, cross-sectional diagrams showing an exemplary method for fabricating a RCAT device in accordance with another embodiment of the present invention.
Figure 9:
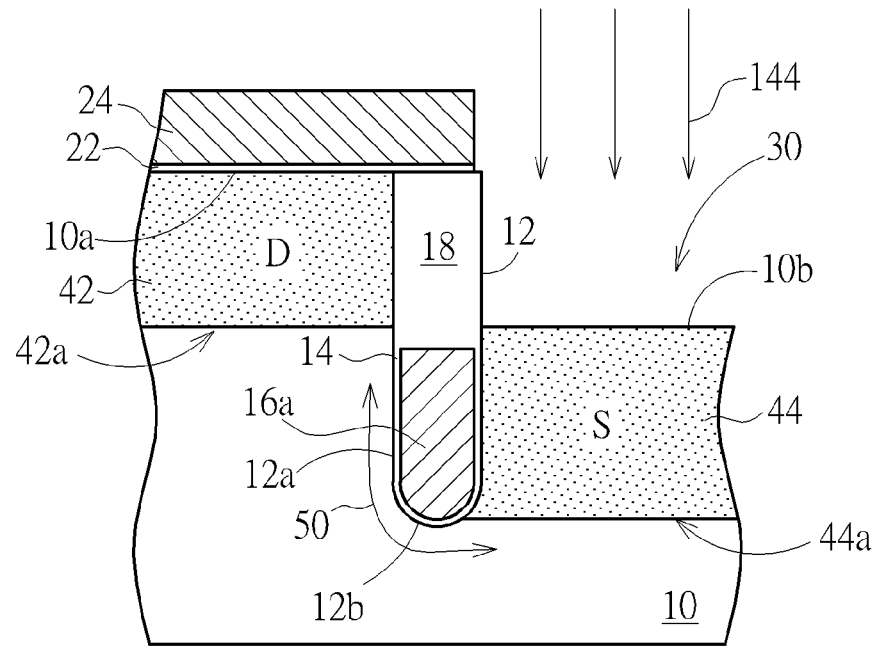
Figure 10:
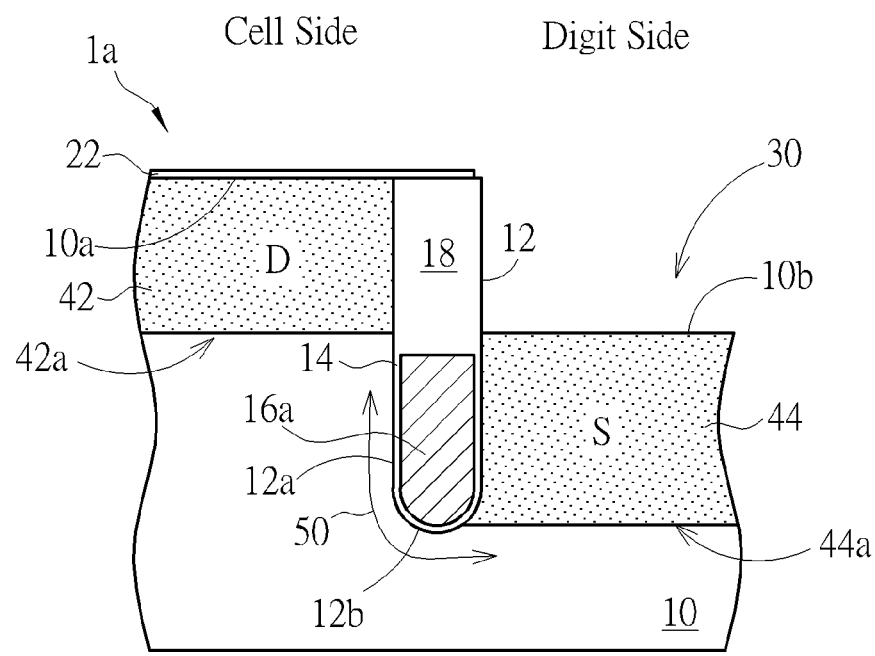

FIGS. 8-10 are schematic, cross-sectional diagrams showing an exemplary method for fabricating a RCAT device in accordance with another embodiment of the present invention. As shown in FIG. 8, after the formation of the buried gate electrode or word line 16a, similar to the process step as depicted in FIG. 4, a planarization process such as a CMP process is carried out to remove excess dielectric layer 18 from the main surface 10a of the semiconductor substrate 10. At this point, the polished top surface of the dielectric layer 18 is substantially flush with the main surface 10a.

Subsequently, anion implantation process 142 is performed to implant dopants such as N type dopants into the main surface 10a of the semiconductor substrate 10, thereby forming a drain doping region 42 on the cell side and a doping region 43 on the digit side. The junction depth of the drain doping region 42 is substantially equal to the junction depth of the doping region 43.

As shown in FIG. 9, a pad layer 22 is then deposited in a blanket manner. The pad layer 22 may be a silicon oxide layer. A hard mask layer 24 such as a silicon nitride layer is then deposited on the pad layer 22. A lithographic process and a dry etching process are performed to from a recess 30 in the semiconductor substrate 10 on the digit side. At this point, a portion of the dielectric layer 18 is revealed within the recess 30.

Using the hard mask layer 24 as an ion implant mask, an ion implantation process 144 is performed to implant dopants such as N type dopants into the semiconductor substrate 10 on the digit side, thereby forming a RCAT device 1a with asymmetric drain doping region 42 and source doping region 44.

Due to the recess 30 on the cell side of the RCAT device 1, the PN junction depth 44a of the source doping region 44 on the digit side can be formed deeper than the PN junction depth 42a of the drain doping region 42 on the cell side. A channel 50 is defined along the sidewall surface 12a on the cell side and along the bottom surface 12b of the trench 12 between the drain doping region 42 and the source doping region 44.

According to the embodiment, preferably, PN junction depth 44a of the source doping region 44 on the digit side may be equal to the depth d of the trench 12. Compared to the prior art RCAT devices, the PN junction depth 42a of the drain doping region 42 on the cell side may be shallower in order to maintain an adequate operation current level when operating the RCAT device 1. A contact (not shown) may be formed on the source doping region 44 to couple to a digit line (not shown).

As shown in FIG. 10, after the ion implantation process 144 is complete, the hard mask layer 24 may be removed.

Figure 11:
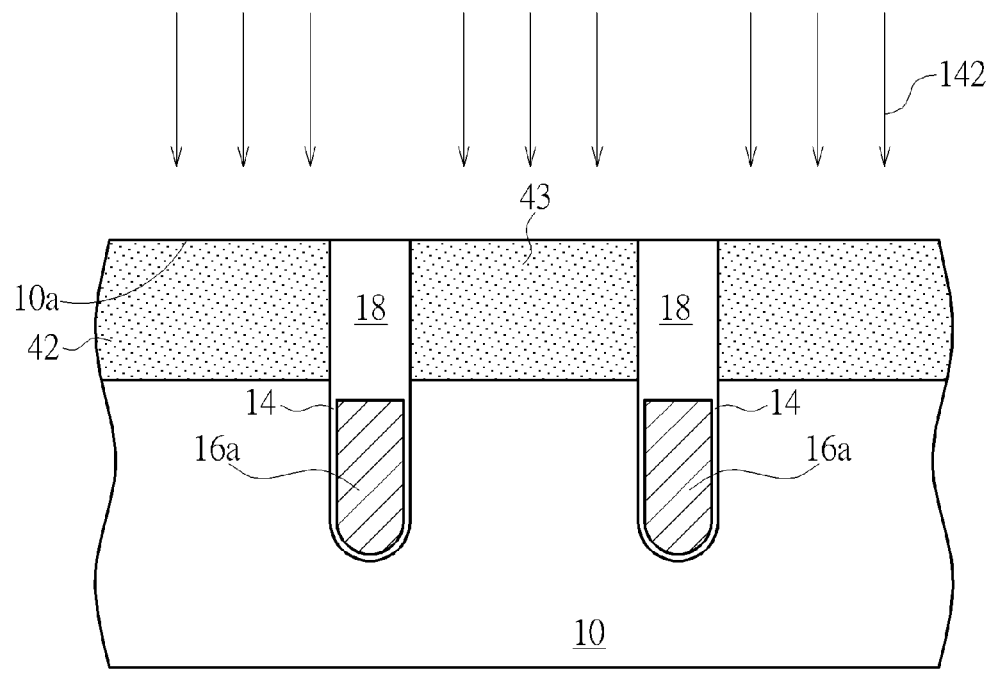
FIGS. 11-13 are schematic, cross-sectional diagrams showing an exemplary method for fabricating a RCAT device in accordance with yet another embodiment of the present invention.
Figure 12:
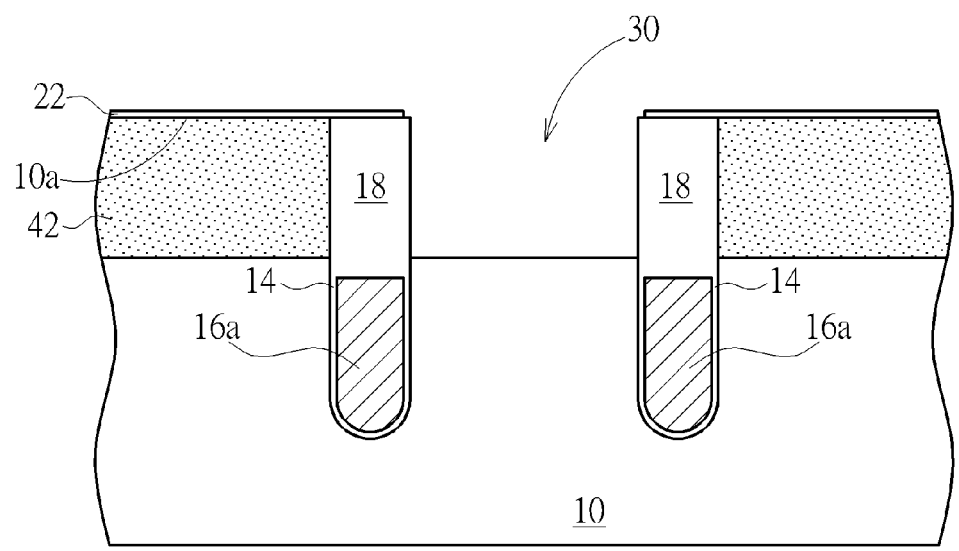
Figure 13:
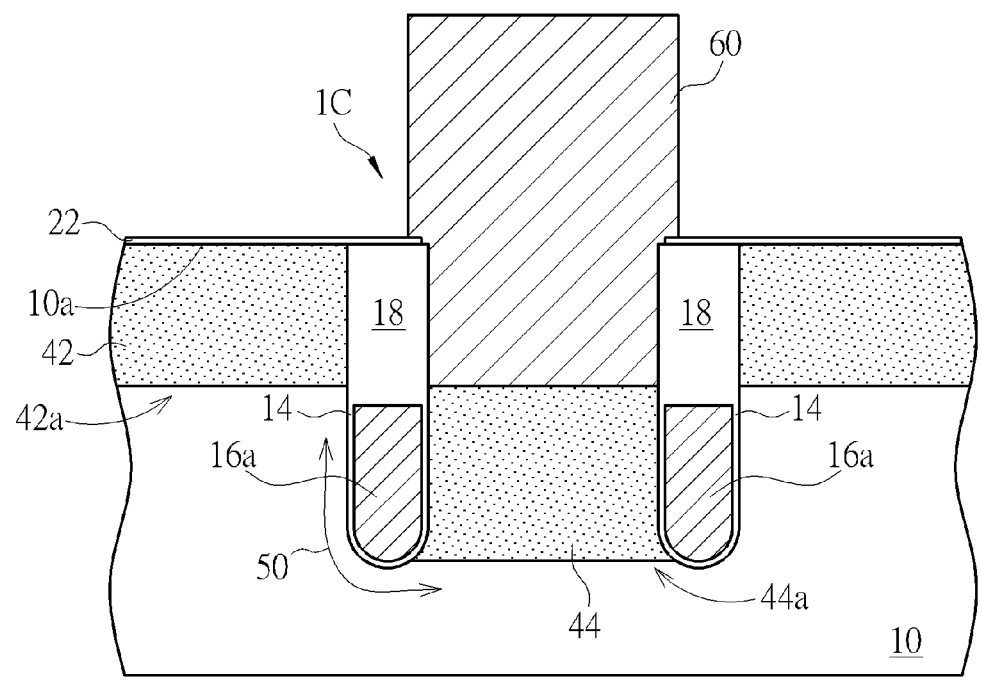

FIGS. 11-13 are schematic, cross-sectional diagrams showing an exemplary method for fabricating a RCAT device in accordance with yet another embodiment of the present invention. As shown in FIG. 11, after the formation of the buried gate electrode or word line 16a, similar to the process step as depicted in FIG. 4, a planarization process such as a CMP process is carried out to remove excess dielectric layer 18 from the main surface 10a of the semiconductor substrate 10. At this point, the polished top surface of the dielectric layer 18 is substantially flush with the main surface 10a.

Likewise, an ion implantation process 142 is performed to implant dopants such as N type dopants into the main surface 10a of the semiconductor substrate 10, thereby forming a drain doping region 42 on the cell side and a doping region 43 on the digit side. The junction depth of the drain doping region 42 is substantially equal to the junction depth of the doping region 43.

As shown in FIG. 12, a pad layer 22 is then deposited in a blanket manner. The pad layer 22 may be a silicon oxide layer. A hard mask layer (not shown in this figure) such as a silicon nitride layer is then deposited on the pad layer 22. A lithographic process and a dry etching process are performed to from a recess 30 in the semiconductor substrate 10 on the digit side. At this point, a portion of the dielectric layer 18 is revealed within the recess 30. Thereafter, the hard mask layer is stripped off, while leaving the pad layer 22 substantially intact.

As shown in FIG. 13, a doped polysilicon layer (not shown) is then deposited on the semiconductor substrate 10 and fills the recess 30. A lithographic process and a dry etching process are performed to pattern the doped polysilicon layer into a contact element 60 situated directly on the recess 30. A thermal process may be performed to drive the dopants from the contact element 60 into the portion of the semiconductor substrate 10 that is in direct contact with the contact element 60, thereby forming a source doping region 44.

The PN junction depth 44a of the source doping region 44 on the digit side may be equal to the depth d of the trench 12. Compared to the prior art RCAT devices, the PN junction depth 42a of the drain doping region 42 on the cell side may be shallower in order to maintain an adequate operation current level when operating the RCAT device 1c. The contact element 60 formed on the source doping region 44 may be coupled to a digit line (not shown).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a recessed channel access transistor device, comprising:
    providing a semiconductor substrate having a trench extending from a main surface of the semiconductor substrate to a predetermined depth;
    forming a gate oxide layer on interior surfaces of the trench;
    forming a buried gate electrode at a lower portion of the trench;
    capping the buried gate electrode with a dielectric layer;
    forming a pad layer and a hard mask layer on the main surface of the semiconductor substrate;
    etching a recess through the pad layer and hard mask layer and into the semiconductor substrate on only one side of the trench, wherein a portion of the dielectric layer is revealed within the recess;
    removing the hard mask layer; and
    after removing the hard mask layer, performing an ion implantation process to implant dopants on both sides of the trench so as to form a source doping region and a drain doping region in the semiconductor substrate, wherein the source doping region has a junction depth that is deeper than that of the drain doping region.

2. The method for fabricating a recessed channel access transistor device according to claim 1 wherein an L-shaped channel is defined along a sidewall surface and a bottom surface of the trench between the drain doping region and the source doping region.

3. The method for fabricating a recessed channel access transistor device according to claim 1 wherein the junction depth of the source doping region is equal to the predetermined depth of the trench.

* * * * *